(12) United States Patent
Fogel et al.

(10) Patent No.: US 9,443,940 B1
(45) Date of Patent: Sep. 13, 2016

(54) DEFECT REDUCTION WITH ROTATED DOUBLE ASPECT RATIO TRAPPING

(71) Applicant: International Business Machines Corporation, Armonk, NY (US)

(72) Inventors: Keith E. Fogel, Hopewell Junction, NY (US); Judson R. Holt, Wappingers Falls, NY (US); Pranita Kerber, Mount Kisco, NY (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/680,328

(22) Filed: Apr. 7, 2015

(51) Int. Cl.
| | |
|---|---|
| H01L 21/20 | (2006.01) |
| H01L 29/32 | (2006.01) |
| H01L 29/10 | (2006.01) |
| H01L 29/165 | (2006.01) |
| H01L 29/205 | (2006.01) |
| H01L 29/66 | (2006.01) |
| H01L 29/78 | (2006.01) |
| H01L 29/06 | (2006.01) |

(52) U.S. Cl.
CPC ........... *H01L 29/32* (2013.01); *H01L 29/0649* (2013.01); *H01L 29/1054* (2013.01); *H01L 29/165* (2013.01); *H01L 29/205* (2013.01); *H01L 29/66795* (2013.01); *H01L 29/7851* (2013.01)

(58) Field of Classification Search
USPC ........................................................ 438/478
See application file for complete search history.

(56) References Cited

U.S. PATENT DOCUMENTS

| | | | |
|---|---|---|---|
| 8,481,341 | B2 | 7/2013 | Clark |
| 8,785,907 | B2 | 7/2014 | Goel et al. |
| 2009/0065047 | A1* | 3/2009 | Fiorenza ............... H01L 31/078 136/255 |
| 2012/0032234 | A1 | 2/2012 | Wang et al. |
| 2013/0043506 | A1 | 2/2013 | Tsai et al. |
| 2014/0342536 | A1 | 11/2014 | Bai et al. |
| 2015/0001587 | A1 | 1/2015 | Yang et al. |
| 2015/0001588 | A1 | 1/2015 | Gunji et al. |
| 2015/0093884 | A1* | 4/2015 | Wang .................. H01L 21/7624 438/479 |

OTHER PUBLICATIONS

"Methods to reduce incidence of V-defect-initiated stacking faults in FETs comprising embedded SiGe", IBM IP.com No. 000152439, IP.com Electronic Publication: May 3, 2007, pp. 1-2.
Pending U.S. Appl. No. 14/578,523, filed Dec. 22, 2014, entitled: "ZIG-ZAG Trench Structure to Prevent Aspect Ratio Trapping Defect Escape", 25 pages.

* cited by examiner

*Primary Examiner* — Timor Karimy
(74) *Attorney, Agent, or Firm* — Yuanmin Cai, Esq.

(57) ABSTRACT

A structure and method for fabricating a heteroepitaxially grown lattice-mismatched semiconductor layer with a lower defect density is disclosed. A first semiconductor layer is epitaxially grown on an upper surface of a lattice mismatched crystalline substrate in a lower trench using a first ART deposition process. The structure is then rotated 90° along a horizontal plane and a second semiconductor layer is epitaxially grown on an upper surface of the first semiconductor layer in an upper trench using a second ART deposition process. This results in an upper portion of the second semiconductor layer being substantially free of epitaxy defects.

18 Claims, 7 Drawing Sheets

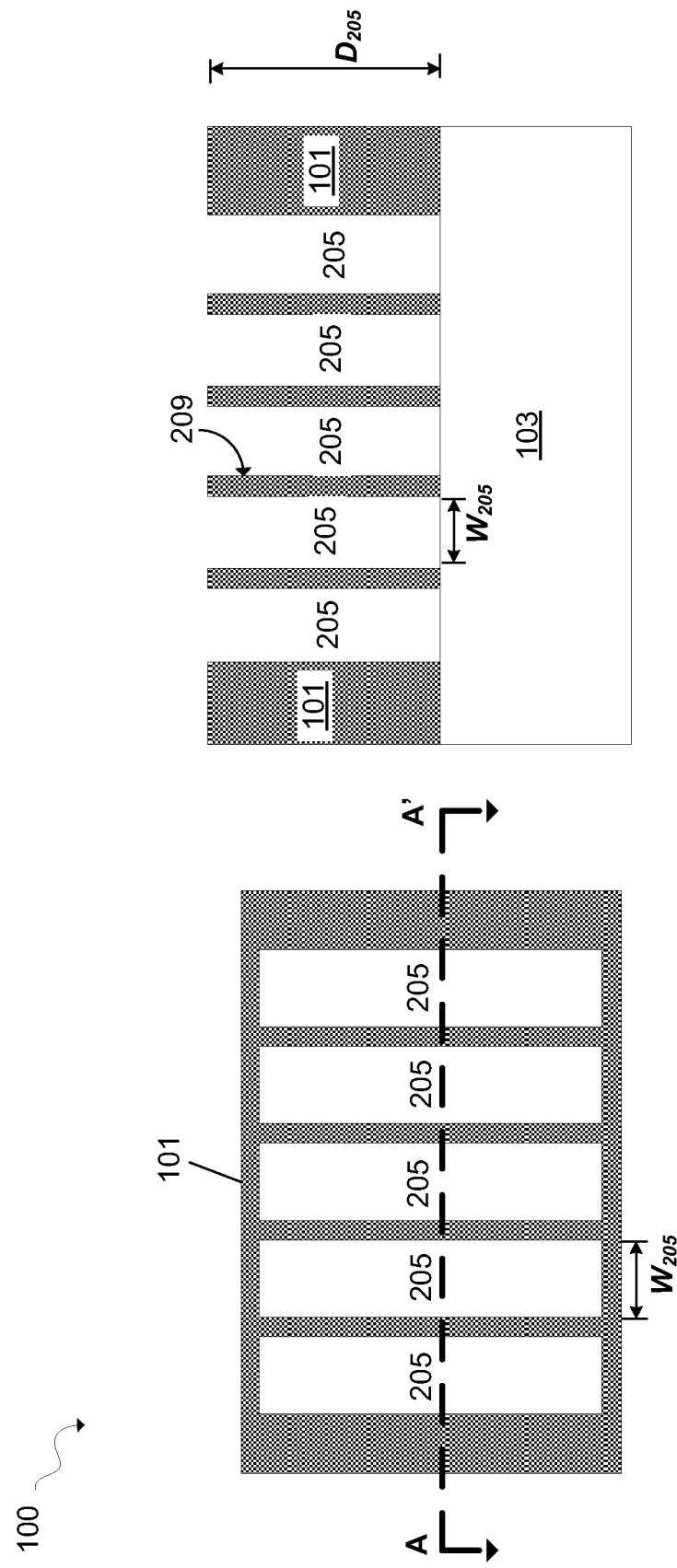

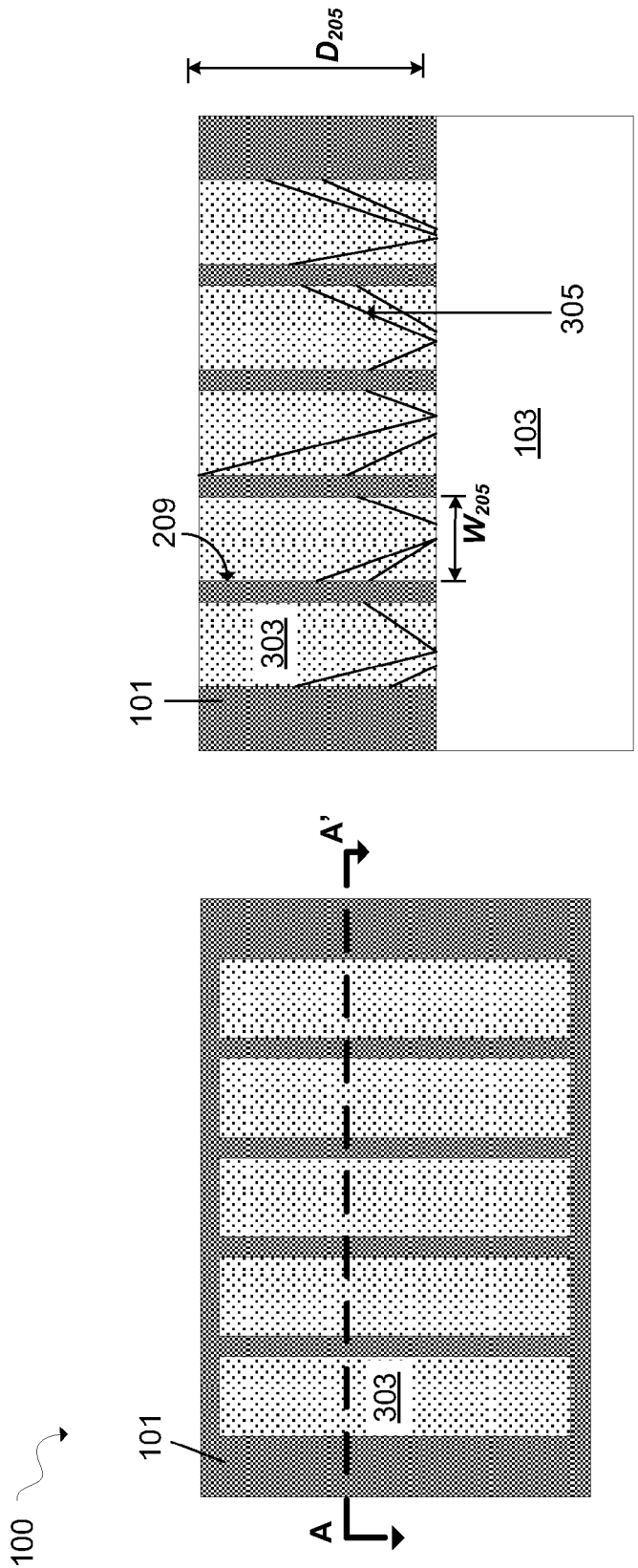

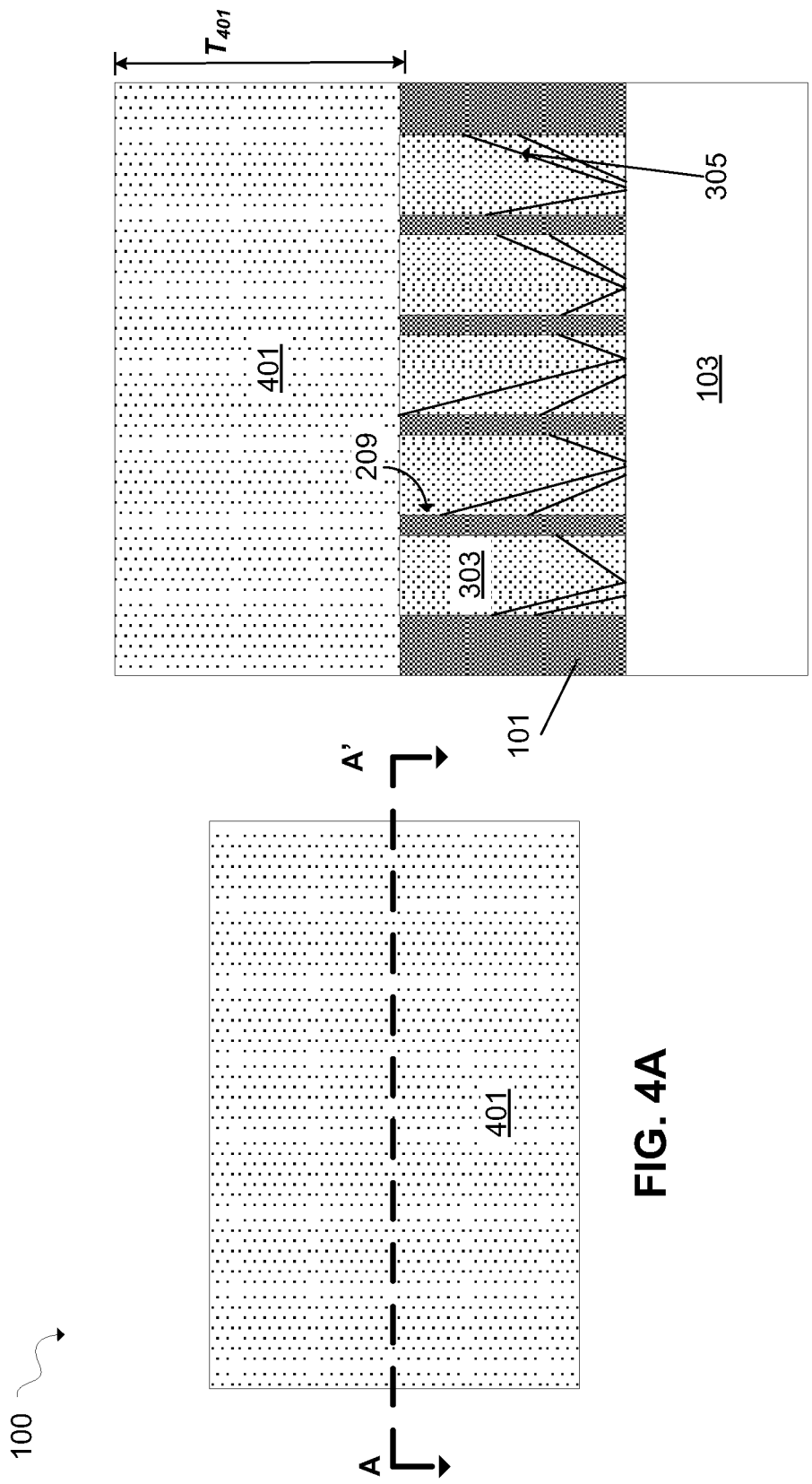

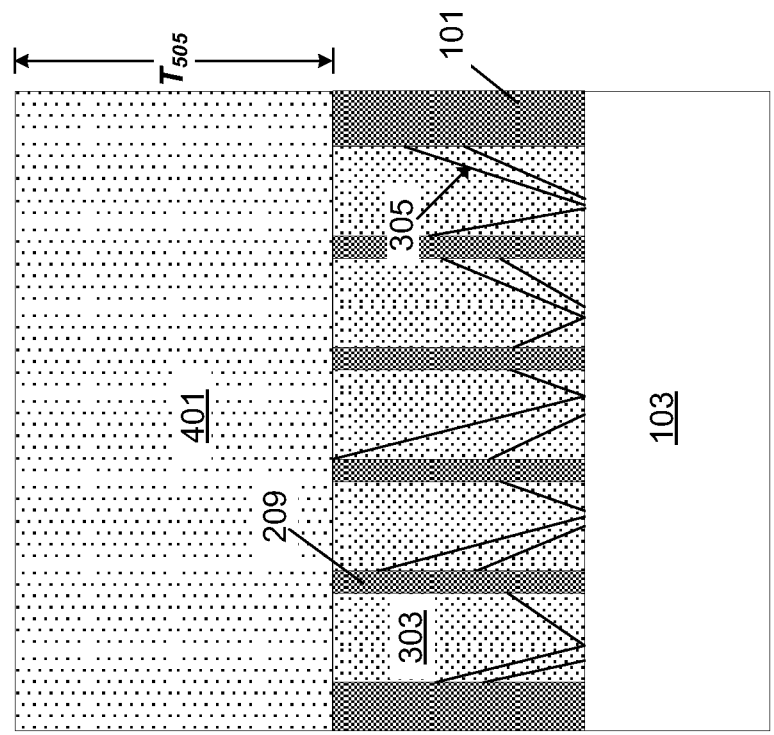
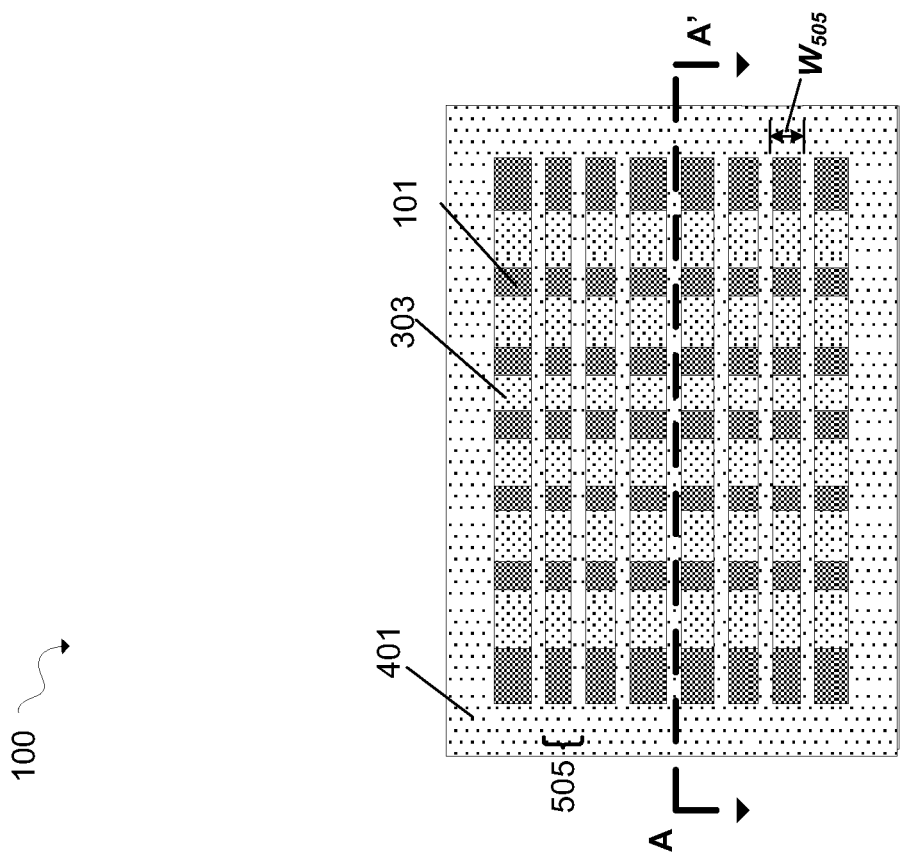
FIG. 5B
FIG. 5A

DEFECT REDUCTION WITH ROTATED DOUBLE ASPECT RATIO TRAPPING

BACKGROUND

Embodiments of the present invention relate generally to semiconductor devices, and more particularly to a structure and method of reducing defect density in materials heteroepitaxially grown on a semiconductor substrate using a rotated double aspect ratio trapping (ART) process.

Heteroepitaxial growth of lattice-mismatched layers (i.e., germanium on silicon, Group III-V compounds on silicon, Group III-V compounds on germanium) have practical applications in advanced complementary metal oxide semiconductor (CMOS) technologies. However, it is challenging to integrate germanium or Group III-V compounds into conventional substrates made of silicon and/or other crystalline dielectric materials using conventional fabrication methods because the mismatch between the crystalline lattice structures of the two materials may lead to high defect formation in the resulting epitaxial structure. The lattice-mismatch creates dislocations, which are crystallographic defects formed during growth of a crystal structure, that ultimately affect the properties of the fabricated crystalline structure.

One conventional approach to reducing dislocations in epitaxially grown crystalline structures is aspect ratio trapping ("ART"). ART is an epitaxial deposition procedure of growing lattice mismatched semiconductor structures in a trench, whereby epitaxy defects are trapped at the trench bottom. However, even with the ART procedure, a considerable amount of defects may still propagate to the surface of the epitaxy in a direction parallel to the trench, with these defects affecting the quality of the epitaxially grown crystalline structure.

SUMMARY

According to an embodiment, a method of reducing crystalline defects in a semiconductor layer is provided. The method may include: performing a first aspect ratio trapping (ART) process to form a first semiconductor layer on a substrate, wherein the first semiconductor layer has sidewalls in contact with a first dielectric layer, and wherein the first dielectric layer has a length longitudinal to a first direction; and performing a second ART process to form a second semiconductor layer on the first semiconductor layer, wherein the second semiconductor layer has sidewalls in contact with a second dielectric layer, and wherein the second dielectric layer has a length longitudinal to a second direction that is perpendicular to the first direction.

According to another embodiment, a method of reducing crystalline defects in a semiconductor layer is provided. The method may include forming a first dielectric layer on a substrate; forming a lower trench in the dielectric layer, wherein the lower trench exposes an upper surface of the substrate, and wherein the lower trench has a length that is longitudinal to a first direction; forming a first semiconductor layer in the lower trench using a first high aspect ratio trapping (ART) process, wherein the first semiconductor layer has an upper surface that is substantially flush with an upper surface of the first dielectric layer; forming a second dielectric layer on the first semiconductor layer and the first dielectric layer; forming an upper trench in the second dielectric layer, wherein the upper trench exposes the upper surface of the first semiconductor layer and the upper surface of the first dielectric layer, and wherein the upper trench has a length that is longitudinal to a second direction that is perpendicular to the first direction; and forming a second semiconductor layer in the upper trench using a second high aspect ratio trapping (ART) process, wherein the second semiconductor layer has an upper surface that is substantially flush with an upper surface of the second dielectric layer.

According to another embodiment, a structure with reduced crystalline defects in a semiconductor layer is provided. The structure may include: a substrate; a first semiconductor layer on the substrate, wherein the first semiconductor layer has a length longitudinal to a first direction; a first dielectric layer on the substrate adjacent to and contacting the first semiconductor layer, wherein the first dielectric layer has a length longitudinal to a first direction; and a second semiconductor layer on the first semiconductor layer and the first dielectric layer, wherein the second semiconductor layer has a crystalline lattice structure that is mismatched from a crystalline structure of the first semiconductor layer by less than approximately 1%, and wherein the second semiconductor layer has a length longitudinal to a second direction that is perpendicular to the first direction.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIG. 2A is a top view and FIG. 2B is a cross section view, both illustrating patterning the first dielectric layer, according to an embodiment of the present invention.

FIG. 3A is a top view and FIG. 3B is a cross section view, both illustrating epitaxially growing a first semiconductor layer, according to an embodiment of the present invention.

FIG. 4A is a top view and FIG. 4B is a cross section view, both illustrating forming a second dielectric layer, according to an embodiment of the present invention.

FIG. 5A is a top view and FIG. 5B is a cross section view, both illustrating patterning the second dielectric layer, according to an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1B:
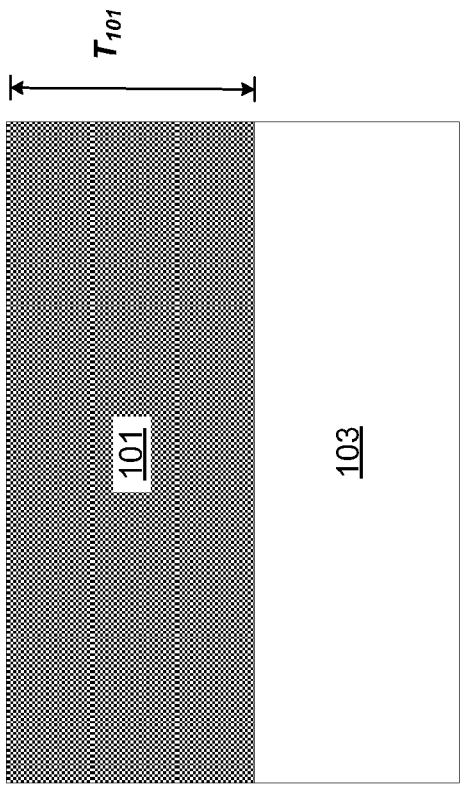
FIG. 1A is a top section view and FIG. 1B is a cross section view, both illustrating a preliminary structure of a first dielectric layer deposited on a substrate, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As used herein, the term "III-V compound semiconductor" denotes a semiconductor material that includes at least one element from Group III of the Periodic Table of Elements (B, Al, Ga, In) and at least one element from Group V of the Periodic Table of Elements (N, P, As, Sb, Bi). Typically, the III-V compound semiconductors may be binary alloys, ternary alloys, or quaternary alloys of III-V elements. Examples of III-V compound semiconductors that can be used in the present invention include, but are not limited to GaAs, InAs, InP, InGaAs, InAlAs, InAlAsSb, InAlAsP, AlInGaP, InGaAsP, and alloys thereof. As used herein, "epitaxy" refers to the deposition of a crystalline overlayer on a crystalline substrate, while "heteroepitaxy" refers specifically to epitaxy performed with materials that are different from each other. Heteroepitaxy implies that although the materials and crystal structures may not be identical, the crystal structures are related, with the substrate or underlying layer templating the crystal structure of the overlayer. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has same or closely similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Embodiments of the present invention relate generally to heteroepitaxial growth of lattice-mismatched semiconductor layers, and more particularly to a structure and method of reducing defect density within a heteroepitaxially grown lattice-mismatched semiconductor layer by performing a rotated double aspect ratio trapping (ART) process. Increasing electron mobility is an essential element in increasing device performance. While devices using Group III-V compounds (such as InAlAs, InAs and InSb) and/or germanium in fin structures have shown great promise in providing the desired increase in electron mobility, integration of Group III-V compounds and/or germanium into conventional CMOS devices is challenging with conventional technologies. This is because of a lattice-mismatch between the epitaxially grown material and a silicon substrate may lead to the formation of dislocations that affect the properties of the epitaxial layer, including electron mobility.

One conventional approach to reducing such dislocation defects arising from a crystalline lattice mismatch is to use ART deposition. The ART deposition process is an epitaxial deposition procedure wherein a material is grown epitaxially, and usually heteroepitaxially, in a narrow trench so that epitaxy defects are trapped at the trench bottom. The ART process may produce a relatively low-defect portion of the epitaxial material in the upper portions of a trench. However, the number of dislocations typically seen in conventional ART processes (approximately $10^6$-$10^7$ dislocations/cm$^2$) may still be an issue in conventional CMOS devices. Embodiments by which to fabricate a heteroepitaxial semiconductor layer with a lower defect density, using a combination of two ART deposition steps in which the structure is rotated 90° between the two epitaxial growth processes, are described in detail below with reference to FIGS. 1A-7B.

Figure 1A:
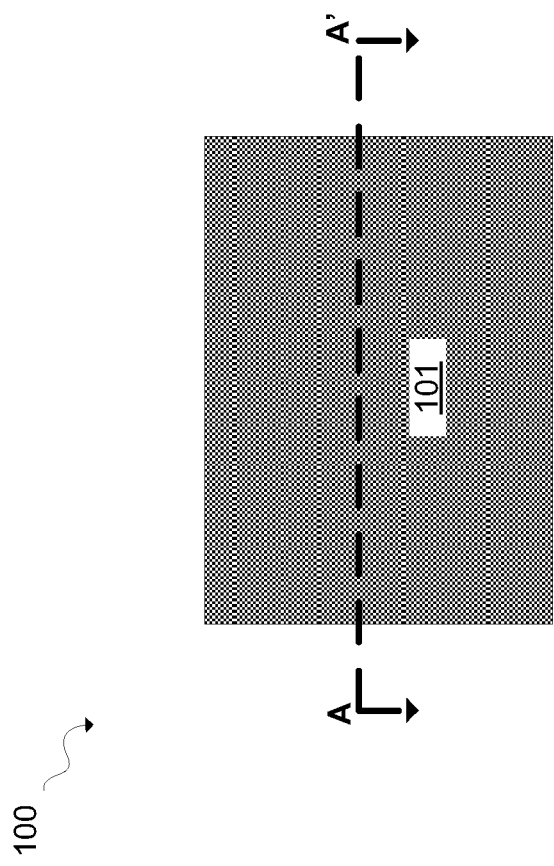

Referring now to FIGS. 1A and 1B, a top view and a cross section view along section line A-A', respectively, of a structure 100 are shown. The structure 100 may be a possible starting point of a rotated double ART process described in detail below. The structure 100 may be formed by depositing a first dielectric layer 101 on a semiconductor substrate 103. The substrate 103 may be composed of any crystalline semiconductor material typically known in the art, including, for example, silicon, germanium, silicon-germanium alloy, and compound (e.g. III-V or II-VI) semiconductor materials. In an embodiment, the substrate 103 may be a bulk substrate. In another embodiment, the substrate 103 may be a semiconductor on insulator (SOI) substrate. In a preferred embodiment, the substrate 103 may be composed of silicon.

The first dielectric layer 101 may be formed on an upper surface of the substrate 103 using a conventional deposition technique, such as, for example, molecular beam epitaxy (MBE), chemical vapor deposition (CVD), plasma enhanced CVD (PECVD), atomic layer deposition (ALD), evaporation, physical vapor deposition (PVD), chemical solution deposition, and other like deposition processes. The first dielectric layer 101 may be composed of a dielectric material including, but not limited to, silicon oxide, silicon nitride, or silicon oxynitride. In an embodiment, the first dielectric layer 101 may be composed of an interlevel or intralevel dielectric material, including inorganic dielectrics and organic dielectrics. The first dielectric layer 101 may be porous or non-porous. In an embodiment, the first dielectric layer 101 may have a thickness $T_{101}$ ranging between approximately 0.1 μm and approximately 1000 μm. In a preferred embodiment, the first dielectric layer 101 may have a thickness ranging between approximately 0.5 μm and approximately 500 μm. In an embodiment, the first dielectric layer 101 material may be planarized after deposition using a conventional technique such as, for example, chemical mechanical planarization (CMP).

Referring now to FIGS. 2A and 2B, a top view and a cross section view along section line A-A', respectively, illustrating forming lower trenches 205 in the first dielectric layer 101 is shown. The lower trenches 205 may be formed using conventional lithographic and etching techniques. In an embodiment, a mask (not shown), such as a photoresist mask, may be formed over the first dielectric layer 101. The mask may be patterned to expose at least a portion of the first dielectric layer 101. The exposed portion of the first dielectric layer 101 may then be removed using a conventional deep reactive-ion etching ("DRIE") process to form the lower trenches 205. In an embodiment, a representative DRIE process for forming the lower trenches 205 may include a Bosch etch process characterized by a very high etching rate, a high aspect ratio, and a high selectivity to oxide/nitride. The Bosch etch process may include an anisotropic etching process that alternates repeatedly between cycles of etching and passivation. The patterned photoresist may be removed after the lower trenches 205 are formed. In an embodiment, portions of the first dielectric layer 101 may remain and may have a length that extends longitudinally along a first direction. The lower trenches 205 may expose an upper surface of the substrate 103. The lower trenches 205 may be substantially rectangular in terms of cross-sectional profile, a top view, or both, and be defined by substantially vertical sidewalls 209. The lower trenches 205 may have a width $W_{205}$ that is smaller than the depth $D_{205}$ of the trench openings. In an embodiment, the lower trenches 205 may have a width to depth ratio ranging from approximately 1:2 to approximately 1:10.

Referring now to FIGS. 3A and 3B, a top view and a cross section view along section line A-A', respectively, illustrating forming a first semiconductor layer 303 in the lower trenches 205 (FIG. 2B) are shown. The first semiconductor layer 303 may be formed by a selective epitaxial growth process, including, but not limited to, rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE), and atomic layer deposition (ALD). The growth temperature may range from approximately 300° C. and approximately 800° C., depending on the composition of the crystalline material and the desired growth rate. In an embodiment, the epitaxial growth process may also utilize low-energy plasma to enhance the layer growth kinetics. The first semiconductor layer 303 may be grown on the upper surface of substrate 103 and may be in contact with the sidewalls 209. In an embodiment, the first semiconductor layer 303 may have the same crystalline characteristics as the substrate 103. For example, in an embodiment where the substrate 103 has a {100} crystal surface, the first semiconductor layer 303 may also take on a {100} orientation. After epitaxial growth is completed, a top portion of the first semiconductor layer 303 may be planarized using a conventional technique, such as, for example, chemical mechanical polishing (CMP) such that an upper surface of the first semiconductor layer 303 is substantially flush with an upper surface of the first dielectric layer 101.

The first semiconductor layer 303 may be composed of materials that include a group IV element or compound, a III-V compound, or a II-VI compound. Examples of suitable group IV elements or compounds include germanium and silicon germanium (SiGe). Examples of suitable III-V compounds include GaAs, GaP, GaSb, GaN, InAs, InP, InSb, InN, AlAs, AlP, AlSb, AN, and/or their ternary or quaternary compounds. Examples of suitable II-VI compounds include ZnSe, ZnTe, CdSe, CdTe, ZnS, and/or their ternary or quaternary compounds.

In an embodiment, a lattice constant of the first semiconductor layer 303 material may be different from a lattice constant of the semiconductor material in the substrate 103, resulting in dislocation defects 305. The dislocation defects 305 arising from a crystalline lattice mismatch may reach and terminate at the sidewalls 209 of the lower trenches 205. Since the first semiconductor layer 303 material is epitaxially grown in the lower trenches 205 using an ART process, most of the dislocation defects 305 may be trapped in lower portions of the first semiconductor layer 303, especially if the width to depth ratio is high. However, a few dislocation defects 305 may nonetheless propagate to an upper surface of the first semiconductor layer 303.

In an embodiment wherein the first semiconductor layer 303 is composed of InP and the width to depth ratio of the lower trenches 205 is approximately 1:10, most of the dislocation defects 305 may terminate within the first 2 μm of InP growth above the substrate 103. Thus, a low-defect region may be created as the epitaxial growth proceeds beyond the defect-trapping region. In an embodiment, a low-defect region of about 8 μm in thickness may be formed above the termination of the dislocation defects 305. The uppermost 5 μm of the first semiconductor layer 303 may have an even lower concentration of dislocation defects 305.

Referring now to FIGS. 4A and 4B, a top view and a cross section view along section line A-A', respectively, illustrating forming a second dielectric layer 401 on the upper surface of the first semiconductor layer 303 and the first dielectric layer 101 are shown. In an embodiment, the second dielectric layer 401 may be substantially similar in composition to the first dielectric layer 101, and may be formed using techniques substantially similar to those used to form the first dielectric layer 101 described above with reference to FIG. 1. In an embodiment, the second dielectric layer 401 may have a thickness $T_{401}$ ranging from approximately 50 nm to approximately 500 nm, with a thickness $T_{401}$ ranging from approximately 100 nm to approximately 200 nm being preferred.

Referring now to FIGS. 5A and 5B, a top view and a cross section view along section A-A', respectively, illustrating forming upper trenches 505 in the second dielectric layer 401 are shown. The upper trenches 505 may be formed using techniques substantially similar to those used to form the lower trenches 205 (FIG. 2) described above with reference to FIG. 2. The upper trenches 505 may be formed perpendicular to the lower trenches 205, such that the upper trenches 505 have a length that runs longitudinally to a second direction, which is perpendicular to the first direction. Accordingly, the remaining portions of the second dielectric layer 401 may be perpendicular to the remaining portions of the first dielectric layer 101. In an embodiment, this may be accomplished by rotating the structure 100 by 90 degrees along a horizontal plane before forming the upper trenches 205. The upper trenches 505 may have a width $W_{505}$ that is smaller than a depth $T_{505}$ of the trench. In an embodiment, the upper trenches 505 may have a width to depth aspect ratio of between approximately 1:2 and approximately 1:10. In an embodiment, the width $W_{505}$ may be equivalent to a desired width of a subsequent fin or active area that may be formed in additional steps.

Figure 6B:
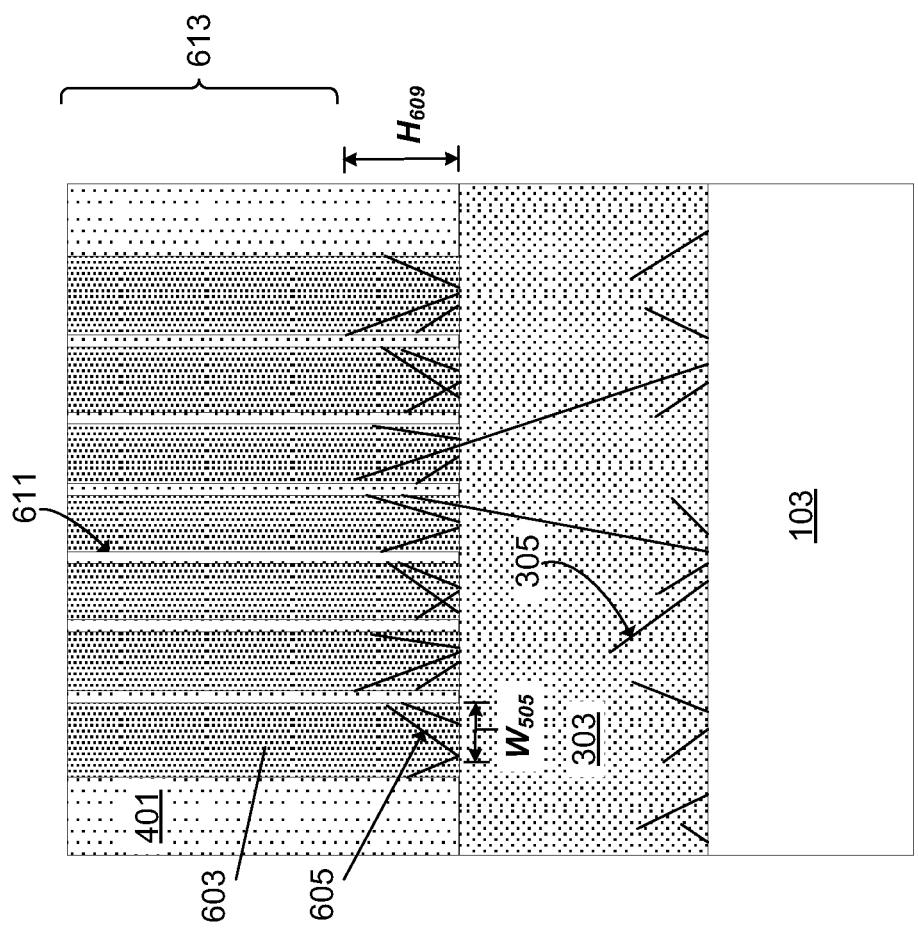
FIG. 6A is a top view and FIG. 6B is a cross section view, both illustrating epitaxially growing a second semiconductor layer, according to an embodiment of the present invention.
Figure 6A:
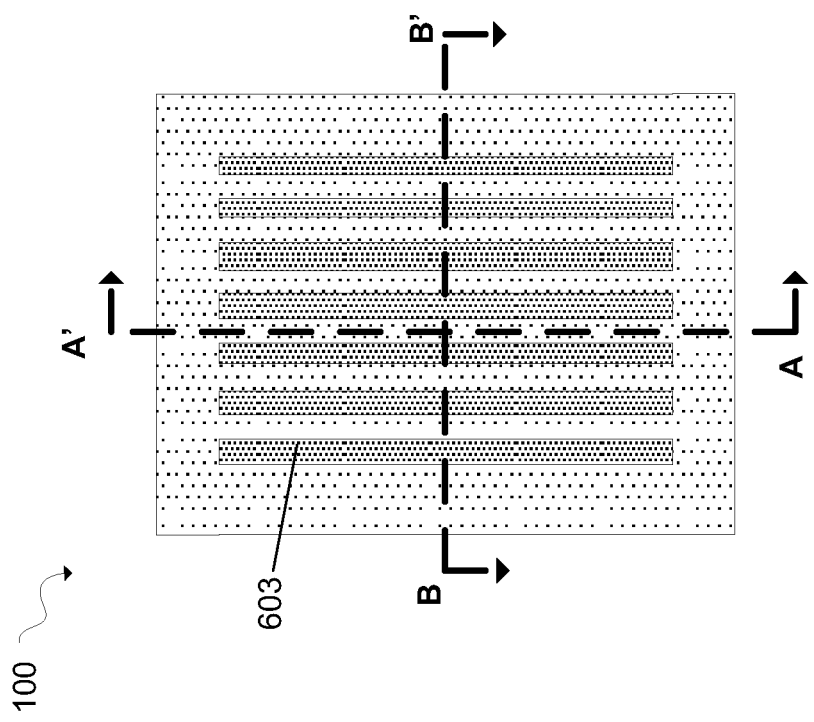

Referring now to FIGS. 6A and 6B, a top view and a cross section view along section line B-B', respectively, illustrating forming a second semiconductor layer 603 in the upper trenches 505 (FIG. 5B) are shown. The second semiconductor layer 603 may be epitaxially grown on the upper surface of the first semiconductor layer 303 and the upper surface of the first dielectric layer 101 and may be in contact with the sidewalls 611 of the upper trenches 505. After epitaxial growth is completed, a top portion of the second semiconductor layer 603 may be planarized using a conventional technique, such as, for example, chemical mechanical polishing ("CMP") such that an upper surface of the second semiconductor layer 603 is substantially flush with an upper surface of the second dielectric layer 401. The second semiconductor layer 603 may or may not be composed of the same material as the underlying first semiconductor layer 303. In an embodiment, the second semiconductor layer 603 may be composed of the same crystalline semiconductor material as the underlying first semiconductor layer 303. In an alternate embodiment, the second semiconductor layer 603 may be composed of a crystalline semiconductor material that has a lattice mismatch of less than approximately 1% with the underlying first semiconductor layer 303.

Due to minimal or zero mismatch between the crystalline lattice of the second semiconductor layer 603 and the crystalline lattice of the first semiconductor layer 303, the amount of dislocation defects 605 in the second semiconductor layer 603 may be minimized during epitaxial growth. However, a few of the dislocation defects 305 from the first semiconductor layer 303 may protrude or otherwise extend into the upper trenches, and may contribute to the dislocation defects 605 in the second semiconductor layer 603. The dislocation defects 605 may reach and terminate at the sidewalls 611 of the upper trenches 505, and may decrease in density with increasing distance from an upper surface of the first semiconductor layer 303. In an embodiment, an upper portion 613 of the second semiconductor layer 603 above a height $H_{609}$ may be substantially exhausted of crystalline lattice defects. The height $H_{609}$ may be approximately twice the width $W_{505}$ of the upper trenches 505 (FIG. 5A) as measured from the upper surface of the first semiconductor layer 303. Other dislocation defects such as stacking faults, twin boundaries, or anti-phase boundaries too may be substantially eliminated from the upper portion 613 of the second semiconductor layer 603.

Figure 7B:
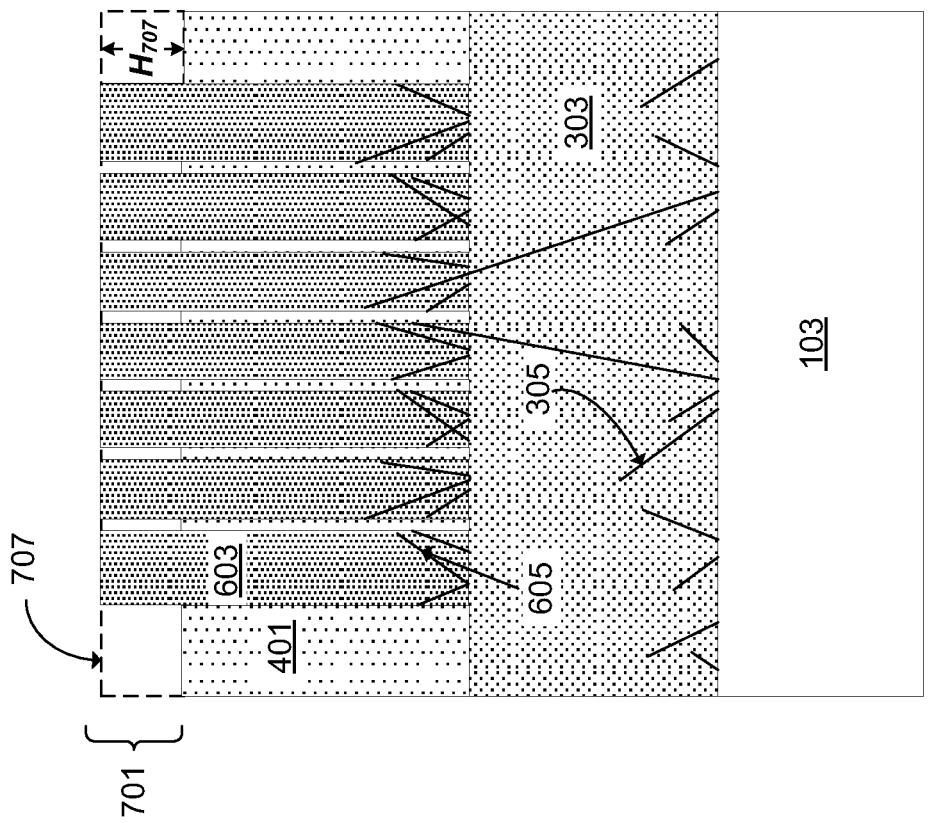
FIG. 7A is a top view and FIG. 7B is a cross section view, both illustrating removing an upper portion of the second dielectric layer, according to an embodiment of the present invention.
Figure 7A:
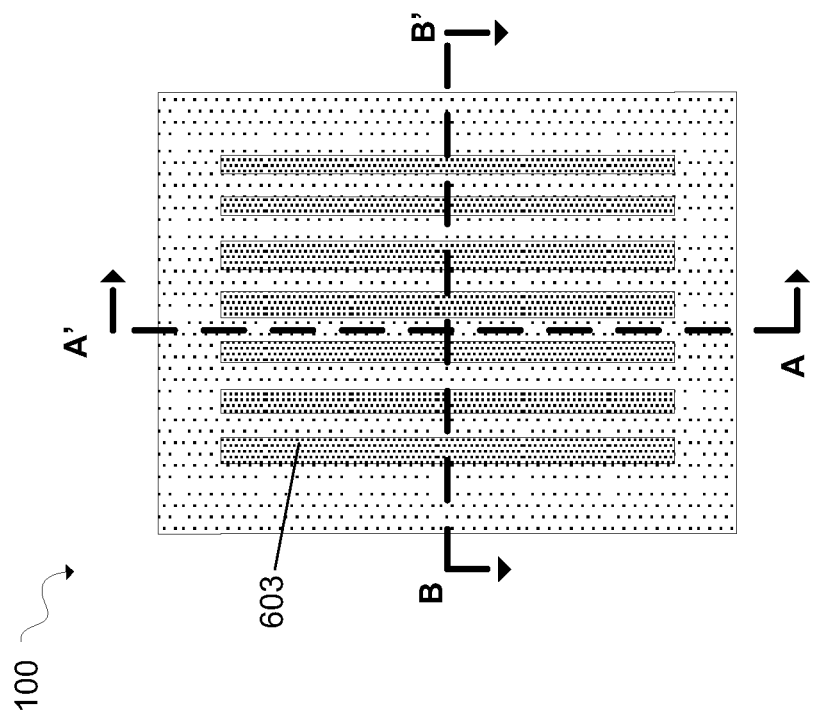

Referring now to FIGS. 7A and 7B, a top view and a cross section view along section B-B', respectively, illustrating forming substantially defect-free semiconductor regions 701 are shown. In an embodiment, an upper portion 707 of the second dielectric layer 401 may be removed selective to the second semiconductor layer 603 using an etching technique well known the art, such as, for example RIE. The substantially defect-free semiconductor regions 701 may be made available for subsequent fabrication of semiconductor devices such as finFETs, with fins composed of the second semiconductor layer 603 having a height $H_{707}$, and other CMOS based device components. In an embodiment, the depth $H_{707}$ and the width $W_{505}$ (FIG. 6B) may represent the pitch and width, respectively, of fins to be formed therein in subsequent steps using the substantially defect-free semiconductor regions 701.

Embodiments of the present invention may reduce the number of dislocations formed during fabrication of lattice mismatched heteroepitaxially grown semiconductor crystalline structures as compared to conventional ART processes. By performing a first ART heteroepitaxial growth of a material in a trench, then rotating the sample along a horizontal plane by 90 degrees, and performing a second ART heteroepitaxial growth, defects and dislocations may be substantially reduced in an upper portion of a second semiconductor layer above a certain height from the upper surface of a first semiconductor layer. For example, in an exemplary embodiment, the dislocation density in the upper portion of the second semiconductor layer may range from approximately $10^2$ dislocations/cm$^2$ to approximately $10^4$ dislocations/cm$^2$. Other dislocation defects such as stacking faults, twin boundaries, or anti-phase boundaries may also be substantially eliminated from the upper portion of second semiconductor layer.

The rotated double ART process may increase the structural fortitude of the second semiconductor layer for subsequent processing, such as in fabricating high-electron-mobility CMOS devices such as finFETs. This structure may be suitable for modern electronic devices that utilize both information processing and communication, as well as other specialized analog semiconductor devices, such as transistors and opto-electronic devices. Embodiments of the present invention may result in fabricating digital devices with superior performance resulting from increased electron mobility along a fin structure thereby decreasing energy consumption of the fin device without decreasing its speed of operation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of reducing crystalline defects in a semiconductor layer comprising:

performing a first aspect ratio trapping (ART) process to form a first semiconductor layer on a substrate, wherein the first semiconductor layer has sidewalls in contact with a first dielectric layer, and wherein the first dielectric layer has a length longitudinal to a first direction; and performing a second ART process to form a second semiconductor layer on the first semiconductor layer, wherein the second semiconductor layer has sidewalls in contact with a second dielectric layer, and wherein the second dielectric layer has a length longitudinal to a second direction that is perpendicular to the first direction.

2. The method of claim 1, wherein the second semiconductor layer comprises the same material as the first semiconductor layer.

3. The method of claim 1, wherein a crystalline lattice of the second semiconductor layer is mismatched from a crystalline lattice of the first semiconductor material by less than 1%.

4. The method of claim 1, wherein a crystal defect arising from a crystalline lattice mismatch between the substrate and the first semiconductor layer is concentrated in the first semiconductor layer and extends only into a lower portion of the second semiconductor layer.

5. The method of claim 1 wherein a dislocation density in the second semiconductor layer ranges from approximately $10^2$ dislocations/cm$^2$ to approximately $10^4$ dislocations/cm$^2$.

6. The method of claim 1, wherein the first ART process comprises:
   forming the first dielectric layer on the substrate;
   forming a lower trench in the first dielectric layer, wherein the lower trench exposes an upper surface of the substrate; and
   epitaxially growing the first semiconductor layer in the lower trench.

7. The method of claim 6, wherein the lower trench has a width to depth ratio ranging from approximately 1:2 to approximately 1:10.

8. The method of claim 1, wherein the second ART process comprises:
   forming the second dielectric layer on the first semiconductor layer and the first dielectric layer;
   forming an upper trench in the second dielectric layer, wherein the upper trench exposes an upper surface of the first semiconductor layer and the first dielectric layer, and wherein the upper trench runs perpendicular to a lower trench; and
   epitaxially growing the second semiconductor layer in the upper trench.

9. The method of claim 8, wherein the upper trench has a width to depth ratio ranging from approximately 1:2 to approximately 1:10.

10. The method of claim 8, wherein a width of the upper trench is equivalent to a chosen fin width or an active area width.

11. A method comprising:
    forming a first dielectric layer on a substrate;
    forming a lower trench in the dielectric layer, wherein the lower trench exposes an upper surface of the substrate, and wherein the lower trench has a length that is longitudinal to a first direction;
    forming a first semiconductor layer in the lower trench using a first high aspect ratio trapping (ART) process, wherein the first semiconductor layer has an upper surface that is substantially flush with an upper surface of the first dielectric layer;
    forming a second dielectric layer on the first semiconductor layer and the first dielectric layer;
    forming an upper trench in the second dielectric layer, wherein the upper trench exposes the upper surface of the first semiconductor layer and the upper surface of the first dielectric layer, and wherein the upper trench has a length that is longitudinal to a second direction that is perpendicular to the first direction; and
    forming a second semiconductor layer in the upper trench using a second high aspect ratio trapping (ART) process, wherein the second semiconductor layer has an upper surface that is substantially flush with an upper surface of the second dielectric layer.

12. The method of claim 11, wherein the lower trench has a width to depth ratio ranging from approximately 1:2 to approximately 1:10.

13. The method of claim 11, wherein the upper trench has a width to depth ratio ranging from approximately 1:2 to approximately 1:10.

14. The method of claim 11, wherein the second semiconductor layer comprises the same material as the first semiconductor layer.

15. The method of claim 11, wherein a crystalline lattice of the second semiconductor layer is mismatched from a crystalline lattice of the first semiconductor material by less than 1%.

16. The method of claim 11, wherein a crystal defect arising from a crystalline lattice mismatch between the substrate and the first semiconductor layer is concentrated in the first semiconductor layer and extends only into a lower portion of the second semiconductor layer.

17. The method of claim 11, wherein the forming the first semiconductor layer in the lower trench using the first high aspect ratio trapping (ART) process comprises:
    epitaxially growing a semiconductor material comprising SiGe or a III-V compound in the lower trench such that a crystalline defect in a lattice structure of the semiconductor material is concentrated in a lower region of the first semiconductor layer.

18. The method of claim 11, wherein the forming the second semiconductor layer in the upper trench using the second high aspect ratio trapping (ART) process comprises:
    epitaxially growing a semiconductor material comprising SiGe or a III-V compound in the upper trench such that a crystalline defect in a lattice structure of the semiconductor material is concentrated in a lower region of the second semiconductor layer.

* * * * *